US009787192B2

(12) United States Patent
Rapisarda et al.

(10) Patent No.: US 9,787,192 B2
(45) Date of Patent: Oct. 10, 2017

(54) POWER-SUPPLY CIRCUIT, RELATED TRANSMISSION CIRCUIT, INTEGRATED CIRCUIT, AND METHOD OF TRANSMITTING A SIGNAL

(71) Applicant: STMicroelectronics S.r.l., Agrate Brianza (IT)

(72) Inventors: Andrea Rapisarda, Motta S. Anastasia (IT); Marco Sammartano, Petrosino (IT); Salvatore Tumminaro, Marianopoli (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 150 days.

(21) Appl. No.: 14/813,498

(22) Filed: Jul. 30, 2015

(65) Prior Publication Data

US 2016/0043647 A1    Feb. 11, 2016

(30) Foreign Application Priority Data

Aug. 8, 2014   (IT) .............................. TO2014A0646

(51) Int. Cl.
  *H02M 3/335*    (2006.01)
  *H03K 17/16*    (2006.01)
  *H02M 1/00*     (2006.01)

(52) U.S. Cl.
  CPC ... *H02M 3/33507* (2013.01); *H02M 3/33523* (2013.01); *H02M 3/33576* (2013.01);
  (Continued)

(58) Field of Classification Search
  CPC ............. H02M 3/335; H02M 3/33523; H02M 3/33546; H02M 3/33576; H02M 2001/0035; Y02B 70/16; H03K 17/162
  (Continued)

(56) References Cited

U.S. PATENT DOCUMENTS

| 6,590,789 B2 | 7/2003 | Bailly |
| 2007/0195559 A1* | 8/2007 | Gong ................ H02M 3/33507 363/21.01 |

(Continued)

FOREIGN PATENT DOCUMENTS

EP    2639951 A2    9/2013

OTHER PUBLICATIONS

Italian Search Report and Written Opinion for IT TO2014A000646 dated Apr. 17, 2015 (9 pages).

(Continued)

*Primary Examiner* — Jue Zhang
*Assistant Examiner* — Jye-June Lee
(74) *Attorney, Agent, or Firm* — Gardere Wynne Sewell LLP

(57) ABSTRACT

A power-supply circuit includes a transformer with primary and secondary windings, and an energy accumulator on the secondary winding. A circuit monitors the secondary winding and generates a feedback signal that is transferred by a transmission circuit through the secondary winding by selectively transferring energy from the energy accumulator. The transmission circuit includes: a) an electronic switch having a control terminal; and b) a driver circuit for driving the electronic switch. The driver circuit includes a charge-accumulation capacitor connected to the control terminal, and a charge circuit configured to draw energy from the secondary winding and charge the charge-accumulation capacitor.

33 Claims, 6 Drawing Sheets

(52) U.S. Cl.
CPC ... *H02M 2001/0035* (2013.01); *H03K 17/162* (2013.01); *Y02B 70/16* (2013.01)

(58) Field of Classification Search
USPC .......................................... 363/21.12, 21.17
See application file for complete search history.

(56) References Cited

U.S. PATENT DOCUMENTS

| | | | |
|---|---|---|---|
| 2011/0096573 A1* | 4/2011 | Zhu | H02M 3/33523 363/21.17 |
| 2013/0235620 A1* | 9/2013 | Morris | H02M 3/335 363/21.12 |
| 2014/0112028 A1 | 4/2014 | Fahlenkamp et al. | |
| 2015/0280586 A1* | 10/2015 | Pasqua | H02M 3/33515 363/21.13 |
| 2015/0303816 A1* | 10/2015 | Tumminaro | H02M 1/08 363/21.04 |

OTHER PUBLICATIONS

Adragna, C. and Gattavari, G.: "STMicroelectronics AN1060 Application Note, Flyback Converters With the L6561 PFC Controller," Jan. 2003, pp. 1-11.

* cited by examiner

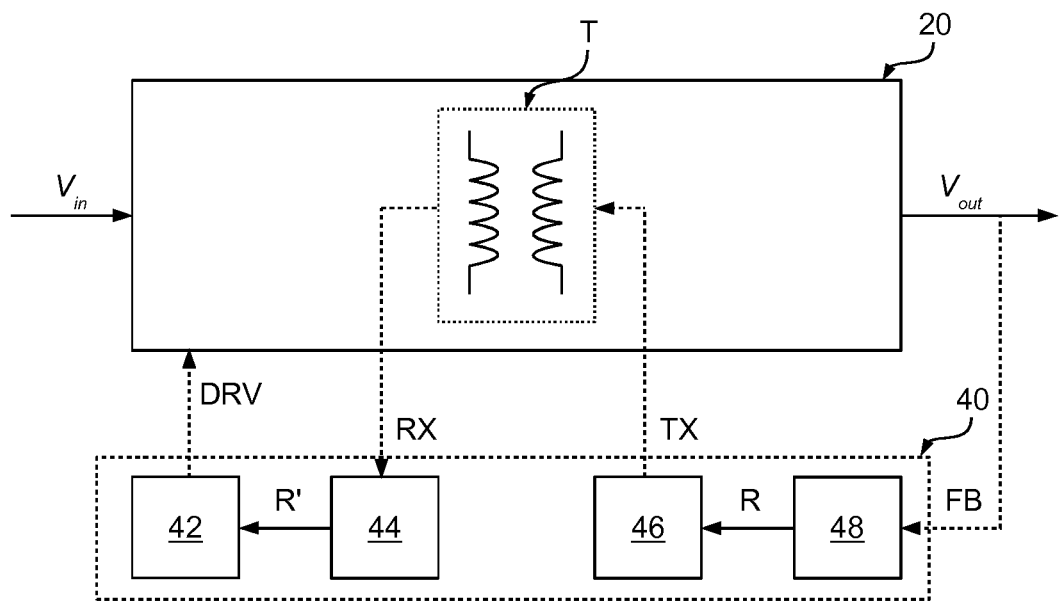
Fig. 5
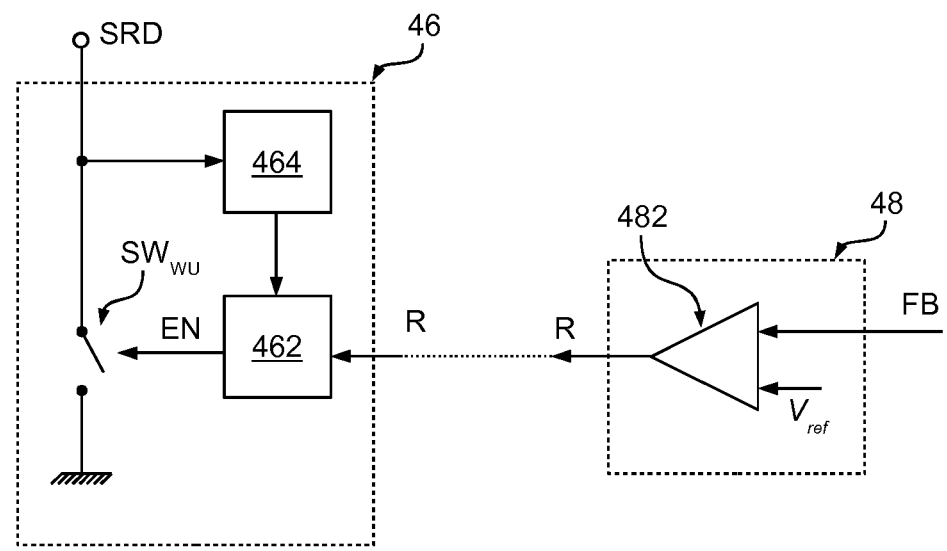
Fig. 7
Fig. 8

POWER-SUPPLY CIRCUIT, RELATED TRANSMISSION CIRCUIT, INTEGRATED CIRCUIT, AND METHOD OF TRANSMITTING A SIGNAL

PRIORITY CLAIM

This application claims priority from Italian Application for Patent No. TO2014A000646 filed Aug. 8, 2014, the disclosure of which is incorporated by reference.

TECHNICAL FIELD

The present disclosure relates to power-supply circuits. Embodiments of the present disclosure regard solutions for devices that provide a wake-up system in a converter for switching power supplies.

BACKGROUND

Power-supply circuits, such as for example AC-to-DC or DC-to-DC switching power supplies, are well known in the art.

FIG. 1 shows an architecture of a power-supply circuit that supplies at output a supply signal for a load LD.

In the example considered, the power-supply circuit comprises an input stage 10, a switching stage 20, an output stage 30, and a control circuit 40.

For instance, the input stage 10 may comprise a rectifier, such as for example a diode bridge, and/or one or more input filters. For instance, frequently the input stage 10 is configured to receive an input AC or DC voltage, for example via the electrical line M, and supplying at output a DC voltage $V_{in}$. In general, in particular when the input voltage M is already a DC voltage, the above filters may also be superfluous, and consequently the input stage 10 is purely optional.

The switching stage 20 consists of an electronic converter comprising at least one electronic switch. There exist many types of electronic converters that are divided mainly into insulated converters and non-insulated converters. For instance, non-insulated electronic converters are converters of the "buck", "boost", "buck-boost", "Cuk", "SEPIC" and "ZETA" type. Instead, insulated converters are, for example, converters of the "flyback", "forward", "half-bridge", and "full-bridge" type. These types of converters are well known to the person skilled in the art.

Finally, the output stage 30 may comprise filters that stabilize the signal $V_{out}$ at output from the switching stage 20. In general, these filters may also be included already in the stage 20, and consequently the output stage 30 is purely optional.

In the above architecture, switching of the switch or switches of the switching stage 20 is usually controlled via a control circuit 40, which opens and closes via at least one driving signal DRV for driving the switch or switches of the switching stage 20 as a function of at least one control signal. In general, there may be used:

a) an open-loop control (or forward, or predictive, or feed-forward control) via a control signal FF picked up, for example, on the input of block 10 or block 20; and/or b) a closed-loop control (or feedback, or backward, control) via a control signal FB picked up, for example, on the output of block 20 or block 30.

For instance, illustrated in FIG. 1 is a feedback of the supply signal at output from block 20, such as for example the output voltage or current. Consequently, in this case, the control circuit 40 can drive the switch or switches of the switching stage 20 in such a way as to reach a desired output voltage or current.

For instance, FIG. 2 illustrates the circuit diagram of a flyback converter that can be used in the stage 20.

As is well known, a flyback converter comprises a transformer T with a primary winding T1 and a secondary winding T2, an electronic switch 204, such as for example an n-channel MOSFET (Metal-Oxide-Semiconductor Field-Effect Transistor) or a bipolar transistor or an IGBT (Insulated-Gate Bipolar Transistor), an output diode Dout, and an output capacitor Cout.

In particular, the transformer T can be modelled as an inductor Lm connected in parallel with the primary winding T1, which represents the magnetization inductance of the transformer T, an inductor Lr connected in series with the secondary winding T2, which represents the dispersion inductance of the transformer T, and an ideal transformer with a given turns ratio 1:n.

In the example considered, the converter 20 receives at input, through two input terminals 202 and $GND_1$, a voltage $V_{in}$ and supplies at output, through two output terminals 206 and $GND_2$, a voltage $V_{out}$ and a current $i_{out}$.

As mentioned previously, the voltage $V_{in}$ can be obtained also from an alternating current at input, for example via the input stage 10, which comprises a rectifier, such as for example a diode or a diode bridge and possibly one or more filters, such as for example capacitors.

In particular, the first input terminal 202 is connected to the first terminal of the primary winding T1 of the transformer T, and the second input terminal $GND_1$ represents a first ground. Instead, the second terminal of the primary winding T1 of the transformer T is connected through the switch 204 to ground $GND_1$. Consequently, the switch 204 can be used for selectively activating the flow of current through the primary winding T1 of the transformer T.

Instead, the first terminal of the secondary winding T2 of the transformer T is connected through a diode Dout to the first output terminal 208, and the second terminal of the secondary winding T2 of the transformer T is directly connected to a second output terminal $GND_2$ that represents a second ground, which, on account of the insulating effect of the transformer T, is preferably different from the ground $GND_1$ and is consequently represented by a different ground symbol. In general, it is sufficient for the secondary winding T2 and the diode Dout to be connected in series between the terminal 206 and the ground $GND_2$.

Finally, an output capacitor Cout is connected in parallel with the output, i.e., between the terminals 206 and $GND_2$.

Consequently, when the switch 204 is closed, the primary winding T1 of the transformer T is directly connected to the input voltage $V_{in}$. This results in an increase in the magnetic flux in the transformer T. Consequently, the voltage across the secondary winding T2 is negative, and the diode Dout is reverse biased. In this condition, the output capacitor Cout supplies the energy required by the load.

Instead, when the switch 204 is open, the energy stored in the transformer T is transferred as flyback current to the load.

As mentioned previously, the control may be in current or in voltage. For this purpose, a control unit 40 is typically used, which drives the switch 204 in such a way that the output voltage $V_{out}$ or the output current $i_{out}$ is regulated on a desired value. For this purpose, a sensor configured for detecting the current $i_{out}$ or the voltage $V_{out}$ may be used in a way in itself known.

Typically, the control unit 40 drives the switch 204 with a modulation of a PWM (Pulse-Width Modulation) type, in which the switch 204 is closed during a first operating interval, and the switch 204 is opened during a second operating interval. The person skilled in the art will appreciate that this PWM driving and control of the duration of the operating intervals are well known and may be obtained, for example, via a feedback of the voltage or of the current at output through an error amplifier. For instance, in the case of a current control, the duration of the first interval is increased until the (mean) current at output reaches a predetermined threshold.

With a PWM driving of this sort, there typically exist three operating modes. In particular, if the current in the magnetization inductance Lm never reaches zero during a switching cycle, the converter is said to be operating in CCM (Continuous-Current Mode). Instead, when the current in the magnetization inductance Lm reaches zero during the period, the converter is said to be operating in DCM (Discontinuous-Current Mode). Typically, the converter operates in discontinuous-current mode when the load absorbs a low current, and in continuous-current mode at higher levels of current absorption. The limit between CCM and DCM is reached when the current reaches zero exactly at the end of the switching cycle. This limit case is referred to as "TM" (Transition Mode). Furthermore, there exists the possibility of driving the switch also with a variable switching frequency, such as for example a resonant or quasi-resonant driving, where the switch 204 is switched when the voltage across the electronic switch 204 is zero or reaches a local minimum. Typically, the switching frequency, i.e., the sum of the durations of the operating periods, is fixed for CCM or DCM driving and variable for quasi-resonant driving.

A problem of these switching power-supply circuits is linked to the electronic consumption of the various components.

For instance, typically the control circuit 40 must always remain turned on for detecting the control signals FF and/or FB and for driving the switching stage 20.

However, at low loads, for example in the absence of loads connected to the converter, the feedback signal or signals FB may change even slowly. For this reason, the energy consumption of the control circuit 40 (and of the entire converter) can be reduced by activating and deactivating the control circuit 40 for certain periods. For instance, the control circuit 40 can be set in an energy-saving mode, the so-called "stand-by mode", and the control circuit 40 can be reactivated periodically and/or as a function of a control signal. Consequently, in this operating mode, the switching stage 20 is not always driven, but switching of the switch or switches of the switching stage 20 is intermittent, and consequently this mode is typically referred to as "burst mode".

For instance, in the sector of switching power supplies with galvanic insulation between the output voltage and the input voltage, the control feedback is usually obtained by means of an optocoupler device, which, in addition to closing the control loop, enables precisely galvanic insulation to be obtained. The advantage of this solution lies in the fact that the frequency of activation of the control circuit 40 and of the stage 20 depends upon the load of the system. However, frequently this solution is inefficient from the standpoint of consumption in stand-by conditions since the consumption of the feedback network of the optocoupler cannot be eliminated.

Other techniques enable execution of the feedback of the output voltage directly from the primary winding, without the aid of an optocoupler. In these systems, in conditions of zero load, the minimum frequency of the burst mode is typically fixed by the device and is a fixed frequency. In these systems, the switch or switches of the stage 20 must be turned back on periodically in order to transfer to the primary winding the information regarding the value of output voltage.

In particular, when the system is turned back on, it supplies at output a fixed energy that has to be dissipated in order to prevent the system from going out of regulation in the case of very low or zero loads. In order to overcome this problem, frequently a dummy load is inserted at output. The energy to be dissipated mainly depends upon the turning-on frequency, which should not be chosen low at will since between one reactivation of switching and the next the system is "blind"; i.e., there is no information on the state of the output. Once switching has taken place, the system can recognize a variation of the load and respond by supplying the necessary energy. In the worst case, i.e., variation of load from zero to the maximum value, the current absorbed by the load is sustained by the output capacitance, and the voltage drop $V_{out}$ depends upon the value of this capacitance (the higher it is, the lower the voltage drop), upon the turning-on frequency (low frequencies result in high voltage drops), and upon the maximum current that can be applied at output.

For this reason, it is necessary to establish, in the design stage, a trade-off between consumption in stand-by conditions and the value of the output capacitance. For instance, to achieve dissipation of powers lower 5 mW there is usually required a turning-on period longer than 4 ms, which results in the use of output capacitances of the order of microfarads.

An example of implementation of this control technique from the primary is described, for instance, in the U.S. Pat. No. 6,590,789 (incorporated by reference).

Like classic insulated switching converters with feedback control obtained by means of an optocoupler, also those with feedback obtained by means of a primary winding consequently present considerable limits as regards obtaining high performance in terms of consumption levels in stand-by or zero-load conditions.

A way to overcome the above problem is to provide a system on the secondary, which, in the burst phase, monitors the output voltage Vout and, when this drops below a certain threshold, "wakes up", by means of an appropriate communication mechanism and wake-up signal, the primary device. In this way, it is possible to obtain low dissipation without the use of high output capacitances.

Since the controller on the secondary is supplied by the output voltage of the converter, it cannot be fully enabled if the output voltage Vout does not reach a given value. In this step, then, since the circuits of the system on the secondary are not driven properly, they could give rise to energy dissipation as well as to the risk of malfunctioning.

SUMMARY

The present disclosure provides solutions that enable one or more of the disadvantages outlined above to be overcome.

Embodiments provide solutions that will enable transmission of a feedback signal in a power-supply circuit, such as for example a wake-up signal useful for reactivating the control circuit during the burst operating mode.

In various embodiments, the power-supply circuit is based upon an insulated electronic converter that comprises a transformer having at least one primary winding and one secondary winding, at least one electronic switch set on the primary side of the transformer for selectively transferring energy through the primary winding to the secondary winding, and an energy accumulator, such as for example a capacitor, set on the secondary side of the transformer, wherein the energy accumulator is charged by means of the energy transferred to the secondary winding.

In various embodiments, the power-supply circuit further comprises a monitoring circuit for monitoring at least one signal on the secondary side of the transformer and generating a feedback signal, and a transmission circuit for selectively transferring energy from the energy accumulator to the secondary winding in order to transmit the feedback signal.

In various embodiments, the transmission circuit comprises a first electronic switch having a control terminal that drives switching of the aforesaid first switch and a driver circuit for the aforesaid first electronic switch. For instance, typically the aforesaid first switch is a pull-down switch that drives switching of a second switch, which is designed to transfer selectively energy from the energy accumulator to the secondary winding in order to transmit the feedback signal. For instance, in various embodiments, the first and second switches are, respectively, a first n-MOSFET and a second n-MOSFET, where the drain of the first transistor is connected to the gate of the second transistor and the source of the first transistor is connected to the source of the second transistor.

Various embodiments of the present disclosure provide solutions that reduce any dissipation of energy and any possible malfunctioning of the transmission circuit.

For instance, in various embodiments, the driver circuit comprises a charge-accumulation capacitor connected to the control terminal of the first switch, and a charge circuit configured to draw energy from the secondary winding and charging the charge-accumulation capacitor by means of the energy drawn off.

Consequently, once the aforesaid charge-accumulation capacitor is charged, the first switch can be kept closed irrespective of switching of the electronic converter.

For instance, in various embodiments, the charge circuit comprises a decoupling capacitor connected to a terminal of the secondary winding for drawing energy from the secondary winding. In various embodiments, the charge circuit comprises a plurality of diodes arranged between the decoupling capacitor and the charge-accumulation capacitor for transferring rising and/or falling transitions of the voltage on the terminal of the secondary winding onto the charge-accumulation capacitor.

Consequently, some embodiments of the present disclosure regard a transmission circuit for transmitting a feedback signal in an electronic converter comprising a transformer, where the transmission circuit comprises an n-MOSFET designed to transfer selectively energy to the secondary winding of the transformer in order to transmit the feedback signal. The transmission circuit further comprises a second n-MOSFET, wherein the drain of the second transistor is connected to the gate of the first transistor and the source of the second transistor is connected to the source of the first transistor. Finally, the transmission circuit comprises a driver circuit for driving the second transistor, wherein the driver circuit comprises a charge-accumulation capacitor connected to the gate of the second transistor and a charge circuit configured for drawing energy from the drain of the first transistor and charging the charge-accumulation capacitor by means of the energy drawn off.

BRIEF DESCRIPTION OF THE DRAWINGS

The embodiments of the present disclosure will now be described purely by way of non-limiting example with reference to the annexed drawings, in which:

FIG. 5 is a block diagram of a system for transmission of a feedback signal according to the present description;

FIGS. 7 to 13 illustrate various details of embodiments of transmission systems according to the present disclosure.

DETAILED DESCRIPTION

In the ensuing description, various specific details are illustrated, which are aimed at an in-depth understanding of the embodiments. The embodiments may be obtained without one or more of the specific details, or with other methods, components, materials, etc. In other cases, known structures, materials, or operations are not illustrated or described in detail so that various aspects of the embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment" or "in one embodiment" that may be present in various points of this description do not necessarily refer to one and the same embodiment. Furthermore, particular conformations, structures, or characteristics may be combined adequately in one or more embodiments.

The references used herein are provided only for convenience and hence do not define the sphere of protection or the scope of the embodiments.

As mentioned previously, the object of the present disclosure is to provide solutions that enable transmission of a feedback signal in a power-supply circuit, such as for example a wake-up signal useful for reactivating the control circuit during the burst operating mode.

Figure 1:
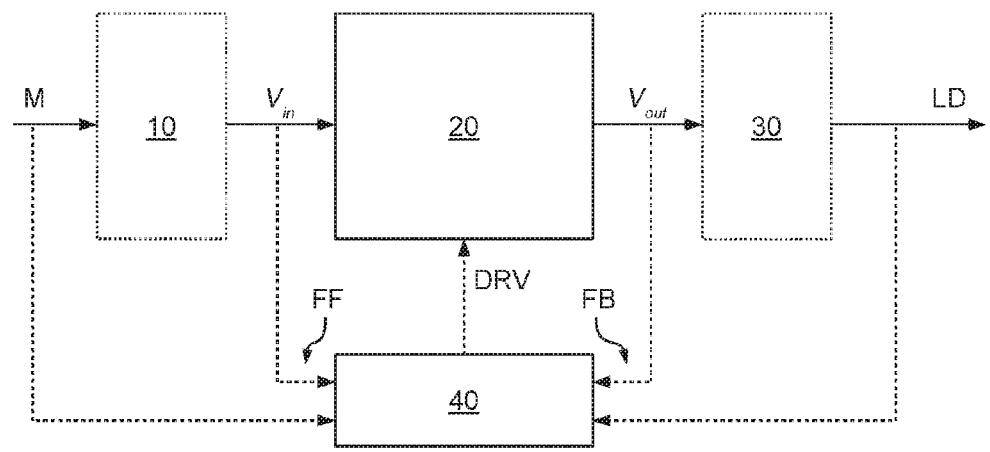
FIGS. 1 and 2 illustrate a power supply circuit and a flyback converter circuit.
Figure 2:
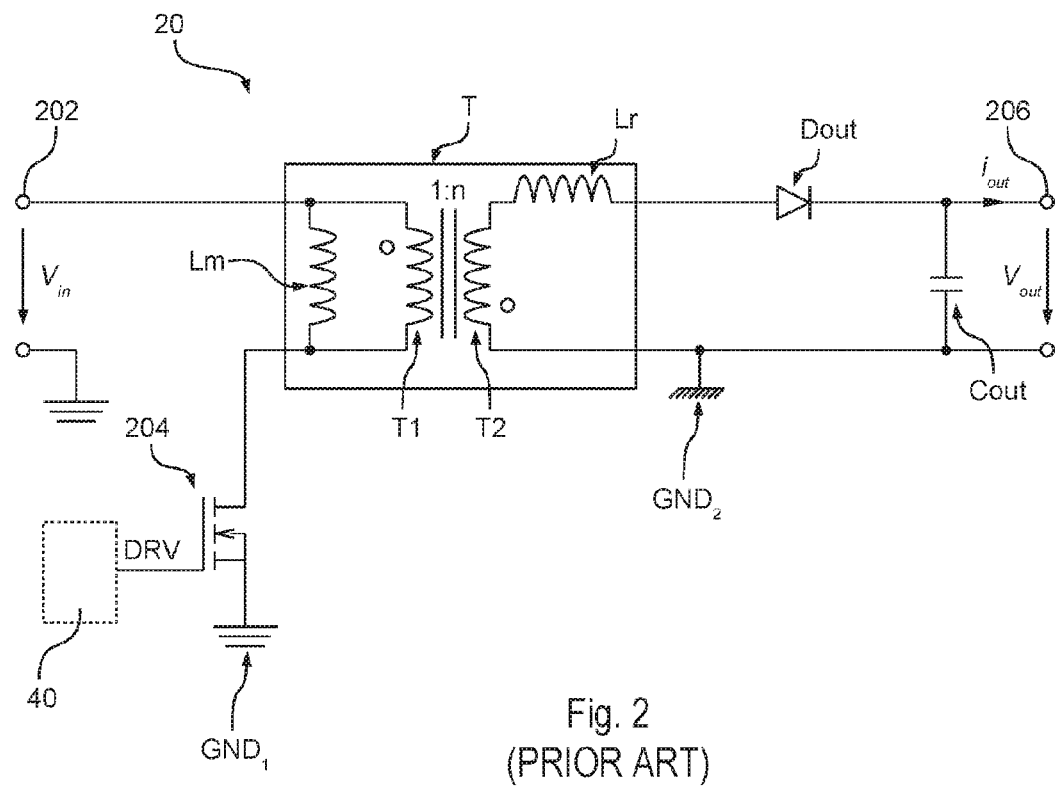

In general, the solutions described herein may be applied to all power-supply circuits that comprise at least one switching stage 20 and one control circuit 40 as shown in FIG. 1.

In particular, in various embodiments, the switching stage 20 is based upon an insulated converter comprising at least one transformer T, such as for example, converters of the "flyback", "forward", "half-bridge", and "full-bridge" type.

In various embodiments, the control circuit 40 drives the stage 20 in burst mode. For this purpose, the control circuit supports at least two operating modes:

a normal operating mode, in which the control circuit 40 drives, i.e., opens and closes, the switch or switches of the switching stage 20; and an energy-saving mode, i.e., a stand-by mode, in which the control circuit 40 does not drive the switch or switches of the switching stage 20, and in which the control circuit 40 returns to the normal operating mode when a signal that signals a given event is detected.

For instance, in the case where the control circuit 40 comprises a digital circuit driven via a clock signal, in the stand-by mode the clock signal can be deactivated or a clock signal with a lower frequency can be used. For instance, such a stand-by mode is frequently envisaged in microcontrollers or other integrated circuits.

Normally, at least one part of the control circuit 40 is supplied with a low voltage VDD, for example between 2 and 12 VDC. Typically, this voltage VDD is referenced to the ground $GND_1$ on the primary side in so far as the control circuit 40 should drive the switch or switches on the primary side of the stage 20.

In general, the above voltage VDD can be obtained directly from the input voltage $V_{in}$.

As an alternative, the supply signal VDD for the control circuit 40 may be obtained also via an auxiliary winding Taux of the transformer T.

Figure 3:
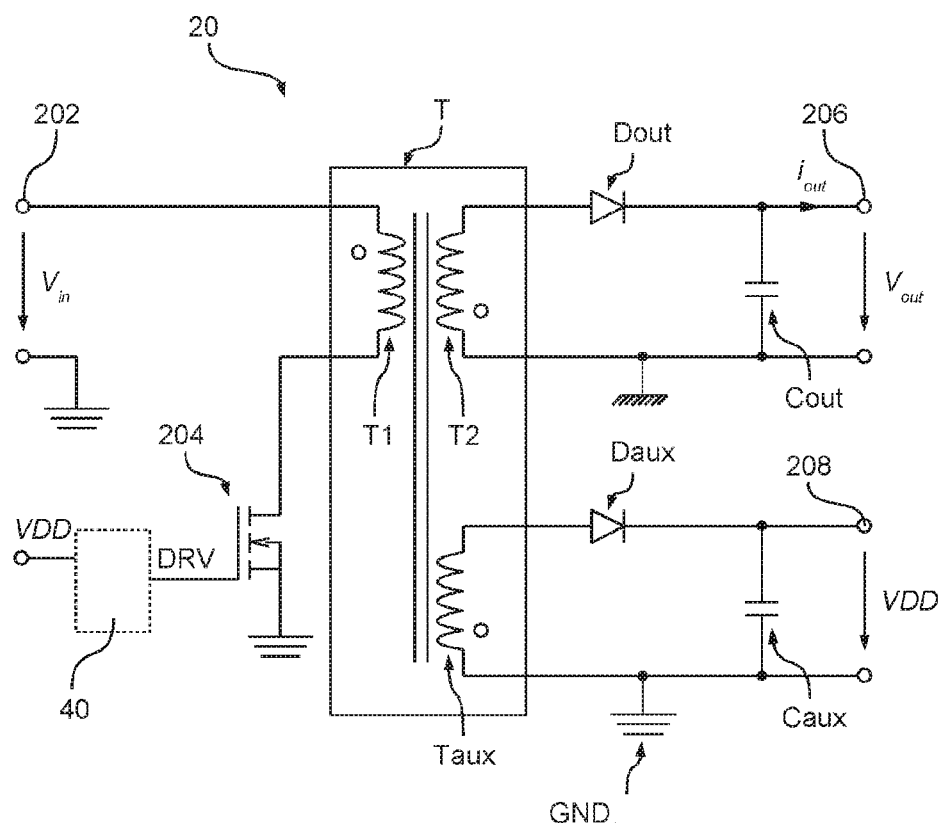
FIG. 3 is a circuit diagram of a flyback converter.

For instance, FIG. 3 shows a solution that can be used in a flyback topology.

In particular, in the embodiment considered, the voltage VDD is supplied through a terminal 208 and the ground $GND_1$.

In the embodiment considered, the transformer T comprises an auxiliary winding Taux. The first terminal of the auxiliary winding Taux of the transformer T is connected through a diode Daux to the terminal 208, and the second terminal of the auxiliary winding Taux of the transformer T is connected directly to the ground $GND_1$. Also in this case, it is sufficient for the auxiliary winding Taux and the diode Daux to be connected in series between the terminal 208 and the ground $GND_1$. Finally, a capacitor Caux is connected in parallel with the output, i.e., between the terminals 208 and the ground $GND_1$.

Consequently, the auxiliary branch (comprising the winding Taux, the diode Daux, and the capacitor Caux) reflects the classic connection on the secondary side of the flyback converter. Consequently, the voltage VDD may be set, for example, by appropriately sizing the number of turns of the auxiliary winding Taux with respect to the number of turns of the secondary winding T2.

The person skilled in the art will appreciate that the above architecture can be applied also to other topologies by providing an auxiliary branch with a connection substantially similar to that of the secondary branch that supplies the main supply signal at high power.

Figure 4:
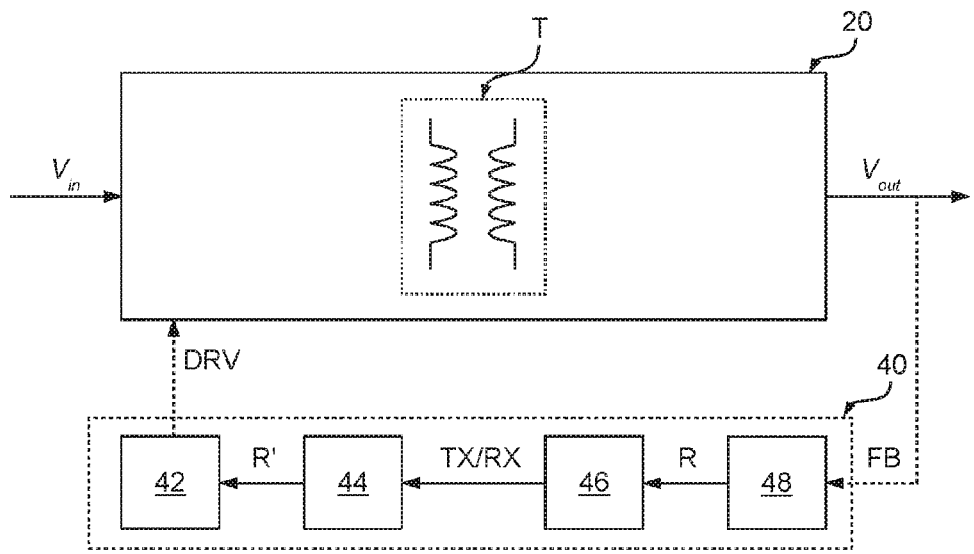
FIG. 4 is a block diagram of a system for transmission of a feedback signal.

FIG. 4 shows an embodiment, in which the control circuit 40 comprises:
- a driver circuit 42 configured for driving the switch or switches of the switching stage 20;
- a monitoring circuit 48 set on the secondary side of the stage 20 and configured for generating a feedback signal R as a function of a signal FB detected on the secondary side of the stage 20; and
- a communication system comprising a transmission circuit 46 and a reception circuit 44 configured for transmitting the feedback signal R from the monitoring circuit 48 to the driver circuit 42.

For instance, a known driver circuit is the integrated circuit L6561, connection and operation of which is described, for example, in the Application Note AN1060, "Flyback Converters with the L6561 PFC Controller", STMicroelectronics (incorporated by reference).

In general, one or more of the circuits 42, 44, 46, and 48 may be integrated in an integrated circuit. For instance, the reception circuit 44 may be integrated together with the driver circuit 42, and/or the transmission circuit 46 may be integrated with the monitoring circuit 48.

In various embodiments, the monitoring circuit 48 is configured for monitoring the output voltage $V_{out}$ or the output current $i_{out}$. For instance, in innovative converters with wake-up system for burst management, when the voltage $V_{out}$ drops below a certain threshold, the monitoring circuit 48 can generate a wake-up signal R that is sent via the communication system 44 and 46 from the secondary side to the primary side of the transformer T, i.e., to the driver circuit 42. In this case, also a feedback system of a "main loop" may be maintained, for example via optocoupler that enables regulation of the voltage or the current during normal operation. The descriptions and the figures hence refer to operation in burst mode, in so far as the main control loop is not illustrated.

In this way, it is possible to obtain low dissipation without the use of high output capacitances, such as for example the capacitor Cout illustrated in FIG. 3, since discharge of this capacitor is detected directly on the secondary side of the transformer T.

In general, the transmission system 46 sends a signal TX in burst mode, and the reception system 44 receives a signal RX. For instance, as described previously, the communication system 44 and 46 may be obtained via an optocoupler (and the corresponding driver and detector circuits) in such a way as to maintain insulation between the secondary side and the primary side.

Instead, FIG. 5 shows an embodiment according to the present description, where the feedback information R, such as for example the wake-up signal, is transmitted through the transformer T of the stage 20; namely, the transmission circuit 46 sends a transmission signal TX to the transformer T of the stage 20, and the reception circuit 44 receives a corresponding reception signal RX through the transformer T, for example, by monitoring the voltage across the primary winding T1 of the transformer or the current that traverses the primary winding T1 of the transformer T.

Instead, in the case where an auxiliary winding Taux is provided (see, for example, FIG. 3), the reception circuit 44 may be configured for monitoring the voltage across the auxiliary winding Taux of the transformer T or the current that traverses the auxiliary winding Taux of the transformer T.

Figure 6:
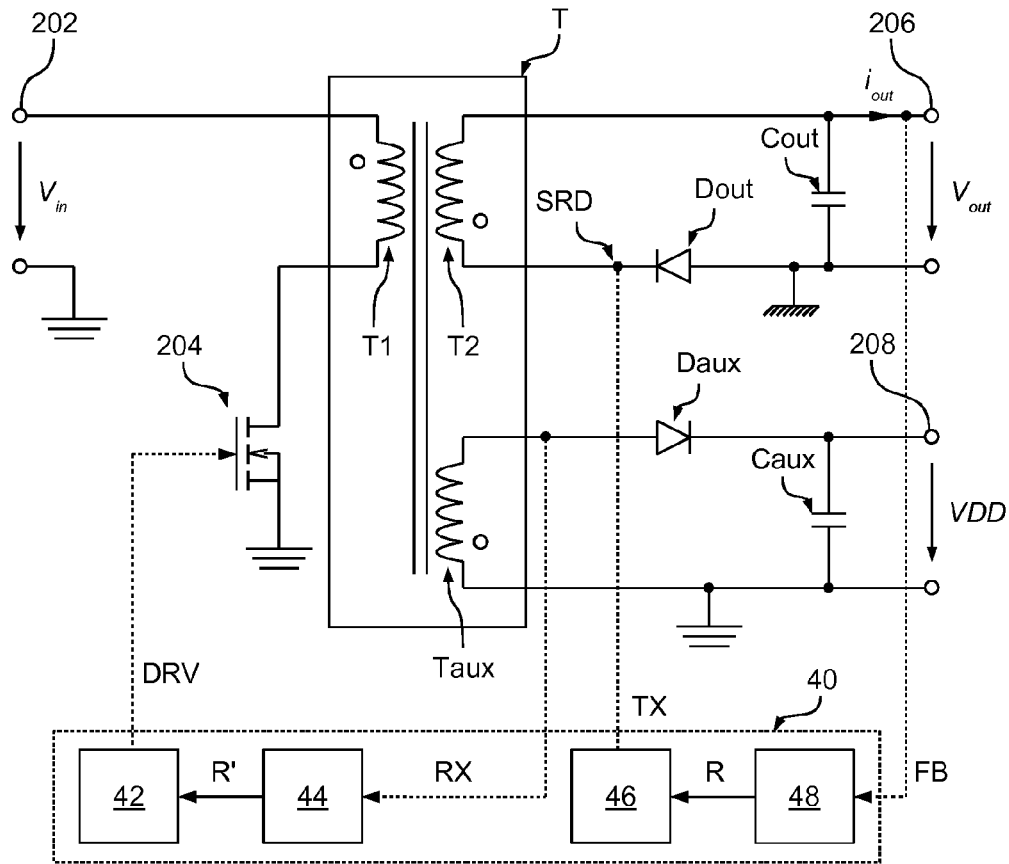
FIG. 6 illustrates a possible embodiment of the system for transmission of a feedback signal in a flyback converter.

FIG. 6 shows a possible embodiment of a control circuit 40 in the case of a power-supply circuit based upon flyback topology.

Also in this case, the control circuit 40 comprises a monitoring circuit 48, a transmission circuit 46, a reception circuit 44, and a driver circuit 42.

In particular, the monitoring circuit 48 supplies a feedback signal R, for example by monitoring the output voltage $V_{out}$ or generally a signal FB on the secondary side of the transformer T. As explained previously, typically this signal R is used as wake-up signal and does not correspond to the main feedback signal, which has the function of regulating the output voltage and/or current during normal operation.

For instance, FIG. 8 shows a possible embodiment of the monitoring circuit 48.

In the embodiment considered, the monitoring circuit 48 comprises a comparator 482 configured for comparing the output voltage $V_{out}$ with a reference voltage $V_{ref}$. For instance, in the embodiment considered, the signal R is high in the case where the voltage $V_{out}$ is lower than the voltage Vref. For instance, in the burst mode the above fact indicates to the driver circuit 42 that switching of the switch or switches of the stage 20 should be resumed.

In the embodiment considered, the transmission circuit 46 comprises means for generating a flow of current through the secondary winding T2 of the transformer T.

For instance, in various embodiments, the transmission circuit 46 comprises an electronic switch connected in parallel to the output diode Dout of a flyback converter, in such a way as to create a flow of current from the capacitor Cout through the secondary winding T2 of the transformer.

In general, the above solution can be implemented also with other topologies of converters that comprise an output capacitor. In fact, in this case, the switch is configured for connecting the output capacitor to the secondary winding T2 of the transformer T in such a way as to generate a flow of current in the secondary winding T2 of the transformer T. Furthermore, instead of an output capacitor also other energy accumulators may be used.

In particular, in the embodiment considered, the diode Dout is connected between the second terminal of the secondary winding T2 and the ground $GND_2$. Consequently, in this case, also the switch can be connected between the second terminal of the secondary winding T2 and the ground $GND_2$.

For instance, as illustrated for example in FIG. 7, the transmission circuit 46 may comprise an electronic switch $SW_{WU}$, such as an n-MOSFET, connected between the second terminal of the secondary winding T2, designated hereinafter by "SRD", and the ground $GND_2$. In the embodiment considered, the transmission circuit 46 further comprises a pulse generator 462 configured for closing the electronic switch $SW_{WU}$ via a driving signal EN in such a way as to generate at least one current pulse in the secondary winding T2.

For instance, a single pulse may be used for transmitting a wake-up signal or interrupt signal, such as for example the signal R supplied by the comparator 482, whereas a number of pulses may be generated for transmitting the bits (possibly encoded) of any digital information.

In some embodiments, the transmission circuit 46 may also comprise a circuit 464 configured for detecting possible switching activities on the primary side of transformer T1. In fact, in this case, the transmission circuit 462 could be configured for transmitting the pulse or pulses only when no switching activity is present that transfers energy from the primary side T1 to the secondary side T2 of the transformer T.

In the embodiment considered, the reception circuit 44 is configured for detecting transmission of the signal transmitted, i.e., the pulse or pulses, by monitoring, for example, the voltage on the auxiliary winding Taux.

Figure 9:
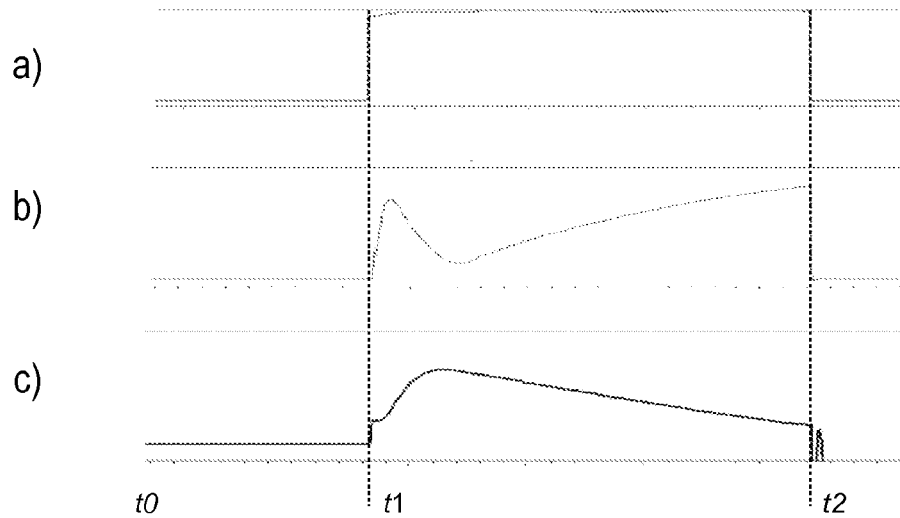

For instance, FIG. 9 shows some possible waveforms for a pulse generated via the transmission circuit 46, where:
waveform a) shows the voltage across the switch $SW_{WU}$;
waveform b) shows the current that traverses the secondary winding T2 of the transformer T; and
waveform c) shows the voltage Vaux across the auxiliary winding Taux of the transformer T.

In particular, in the embodiment considered, when the control circuit 40, in particular the driver circuit 42, operates in burst mode, for example in the presence of low loads, the driver circuit 42 interrupts after certain time intervals switching of the switch or switches of the stage 20 and preferably activates the energy-saving mode. At this point, the driver circuit 42 starts to switch again only when a wake-up pulse is received.

Consequently, at an instant t0 no switching activity is present that can be detected for example via the circuit 464.

At an instant t1 the monitoring circuit 48 detects the fact that the output voltage $V_{out}$ has dropped below the threshold $V_{ref}$, and the transmission circuit 46 closes the switch $SW_{WU}$, for example by driving the switch $SW_{WU}$ with the logic level "1".

The inventors have noted that driving of such a transmission transistor $SW_{WU}$ on the secondary side of the transformer is particularly critical.

Figure 10:
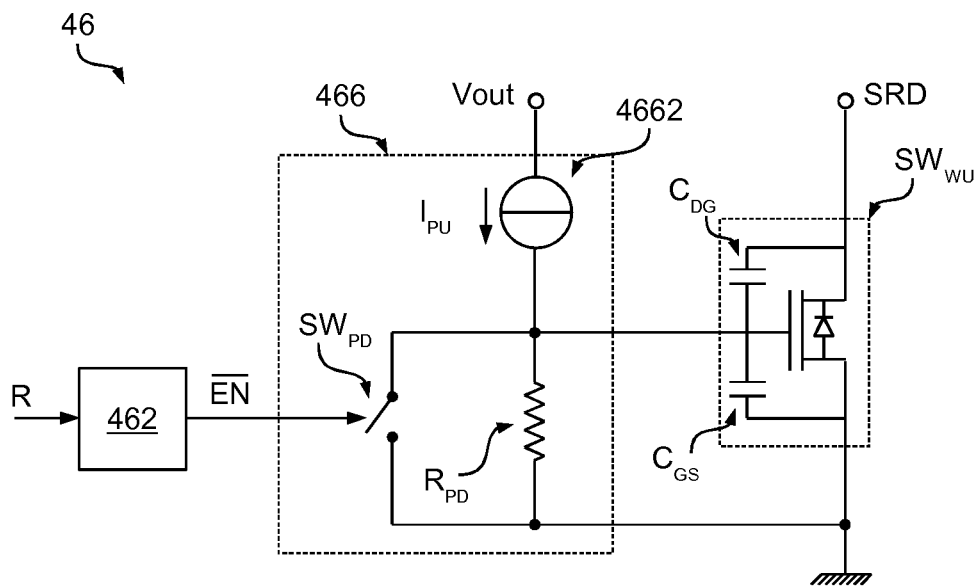

FIG. 10 shows a possible embodiment of the transmission circuit 46.

In the embodiment considered, the switch $SW_{WU}$ of FIG. 7 is implemented via an n-MOSFET (n-MOS), which is configured for connecting the second terminal SRD of the secondary winding to the ground $GND_2$; i.e., the drain of the transistor $SW_{WU}$ is connected (for example, directly) to the terminal SRD, and the source of the transistor $SW_{WU}$ is connected (for example, directly) to the ground $GND_2$. However, in general it is sufficient for the aforesaid switch $SW_{WU}$ to be connected between the output capacitor Cout and the secondary winding T2 for transferring energy from the output capacitor Cout to the secondary winding T2.

Instead, the gate of the transistor $SW_{WU}$ is driven as a function of the signal R. For instance, in the embodiment considered, the transmission circuit 462 is provided, which generates a signal EN for enabling the transistor $SW_{WU}$, for example for transmitting at least one pulse. Furthermore, a driver circuit 466 is provided, which drives the gate of the transistor $SW_{WU}$ as a function of the signal EN.

In particular, in the embodiment considered, the driver circuit 466 comprises a pull-up resistor or, as illustrated in FIG. 9, a current generator 4662, which supplies a current $I_{PU}$. For instance, the current generator 4662 may be connected between the output voltage $V_{out}$ and the gate of the transistor $SW_{SW}$. In the embodiment considered, the circuit 466 further comprises a resistor $R_{PD}$ and a switch $SW_{PD}$, such as for example an n-MOSFET, connected in parallel between the gate of the transistor $SW_{WU}$ and the ground $GND_2$, i.e., the source of the transistor $SW_{WU}$.

Consequently, normally the switch $SW_{PD}$ is closed and the voltage $V_{GS}$ on the gate of the transistor $SW_{WU}$ is zero, and the transistor $SW_{WU}$ is off. Instead, during sending of the current pulse, the switch $SW_{PD}$ is opened, and the transistor $SW_{WU}$ is turned on with a fixed voltage $V_{GS}$ represented by the current $I_{PU}$ that flows in the resistance $R_{PD}$.

Consequently, in the embodiment considered, the driver circuit 466 should be driven with an inverted enabling signal EN.

The inventors have noted that, on account of the transitions that the node SRD undergoes at the start and at the end of demagnetization of the transformer T, the gate of the transistor $SW_{WU}$ is subjected to charge injections that, during the rising transition of the node SRD, may turn on the transistor $SW_{WU}$. This turning-on would cause loss of part of the energy stored in the transformer and in the output capacitance, hence a loss of efficiency of the converter, as well as possibly being the cause of malfunctioning due to simultaneous conduction of the primary winding T1 and the secondary winding T2 of the transformer T. It should thus be avoided by sizing the on-resistance $R_{ON\_SW_{PD}}$ of the switch $SW_{PD}$.

In order to prevent turning-on of the transistor $SW_{WU}$, during the rising transition of the node SRD, the following condition for the on resistance $R_{ON\_SW_{PD}}$ of the switch $SW_{PD}$ should be met:

$$R_{ON\_SW_{PD}} << \frac{\Delta T_{Rm}}{2 \cdot C_{GD} \cdot \left( \frac{V_{SRD,max}}{V_{TWU}} - \frac{C_{GD}}{C_{GS}} - 1 \right)} \quad (1)$$

where $C_{DG}$ is the capacitance of the transistor $SW_{WU}$ between drain and gate, $C_{GS}$ is the capacitance of the transistor $SW_{WU}$ between gate and source, $\Delta T_{RM}$ is the minimum time that the node SRD takes to reach the maximum voltage $V_{SRD,max}$, and $V_{TWU}$ is the threshold voltage of the transistor $SW_{WU}$.

Furthermore, as mentioned previously, in some embodiments, the transmission circuit 46 is supplied via the output voltage $V_{out}$ of the converter. For this reason, at start up, i.e., turning-on of the power-supply circuit, the transmission circuit 46 should not be enabled until its supply voltage reaches a given value. Likewise, if the converter is functioning, for example, as battery charger regulating the current $i_{out}$, the voltage $V_{out}$ will be fixed by the load and might not be sufficient to enable the circuit of the secondary. However, in these conditions also the monitoring circuit 48 and/or the pulse generator 462 that closes the switch $SW_{PD}$ are/is not active, and the gate of the transistor $SW_{WU}$ is connected to ground through the resistance $R_{PD}$. This resistance is much higher than the on-resistance of the switch $SW_{PD}$ and hence does not always guarantee that the transistor $SW_{WU}$ will not switch on, owing to capacitive coupling, during the transitions of the node SRD.

The above switching-on of the transistor $SW_{WU}$ leads to a loss of energy that in some cases could be unacceptable for the requirements of efficiency of the converter, in addition to the risk of any possible malfunctioning.

In an embodiment, in order to prevent this behavior and limit the loss of energy at turning-on of the power-supply circuit, an active pull-down is used instead of the resistor $R_{PD}$ for driving the gate of the transistor $SW_{WU}$.

For instance, in some embodiments the above active pull-down is obtained via an additional transistor $SW_{MN}$, such as for example an n-MOSFET, connected between the gate of the transistor and the ground $GND_2$. In particular, in some embodiments, the drain of the transistor $SW_{MN}$ is connected to the gate of the transistor $SW_{WU}$, and the source of the transistor $SW_{MN}$ is connected to the source of the transistor $SW_{WU}$.

Figure 11:
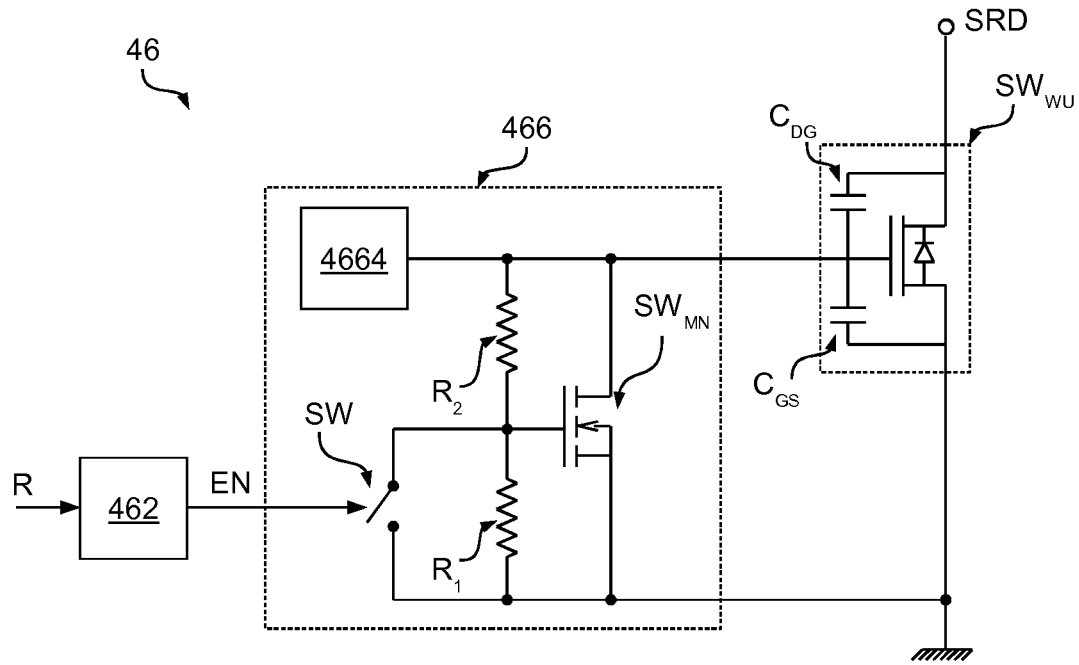

For instance, FIG. 11 shows a first embodiment.

In particular, in the embodiment considered, the circuit comprises as previously a circuit 4664 that supplies a current, such as for example a pull-up or a current generator connected to the voltage Vout.

In the embodiment considered, the driver circuit 466 further comprises a voltage divider including two resistors R1 and R2, which are connected between the gate of the transistor $SW_{WU}$, i.e., the drain of the transistor $SW_{MN}$, and the ground $GND_2$, i.e., the source of the transistor $SW_{MN}$. Instead, the intermediate point of the voltage divider is connected to the gate of the transistor $SW_{MN}$. Finally, an electronic switch SW, such as for example an n-MOSFET, is connected in parallel with the lower resistor $R_1$, i.e., between the gate and the source of the transistor $SW_{MN}$.

Consequently, the switch SW can be used for disabling the clamp R1, R2, and its enabling signal, in this case the signal EN, coincides with the enabling signal of the transistor $SW_{WU}$.

Also in this case, the circuit should be sized in such a way that the equivalent resistance of the transistor $SW_{MN}$ respects the same condition defined previously for the transistor $SW_{WU}$, namely $$R_{DS}\left(V_{GS}=V_{TWU}\cdot\frac{R_1}{R_1+R_2};\,V_{DS}=V_{TWU}\right)<< \quad (2)$$

$$\frac{\Delta T_{Rm}}{2\cdot C_{GD}\cdot\left(\frac{V_{SRD,max}}{V_T}-\frac{C_{GD}}{C_{GS}}-1\right)}$$

The inventors have noted that this solution may prove very costly, from the standpoint of occupation of area, in the case where the threshold voltage $V_{TWU}$ of the transistor $SW_{WU}$ has a value close to the threshold voltage $V_{TMN}$ of the transistor $SW_{MN}$. For instance, in the limit case, by removing the resistor $R_1$, the transistor $SW_{MN}$ would reach a maximum overdrive voltage equal to $V_{TWU}-V_{TMN}$. If the two threshold voltages were very close, the transistor $SW_{MN}$ would work with very low overdrive and its occupation of area, in order to obtain the desired resistance $R_{DS}$, could even be greater than that of the transistor $SW_{WU}$. Furthermore, in the case where the transistor $SW_{WU}$ had a lower threshold voltage $V_{TWU}$, this solution could not be adopted.

To overcome these problems, in one embodiment, a driver circuit is used for the pull-down transistor $SW_{MN}$, which draws energy, in the form of electrical charge, from the node SRD (or in general from the secondary winding T2) to use it during turning-on of the transistor $SW_{MN}$.

Figure 12:
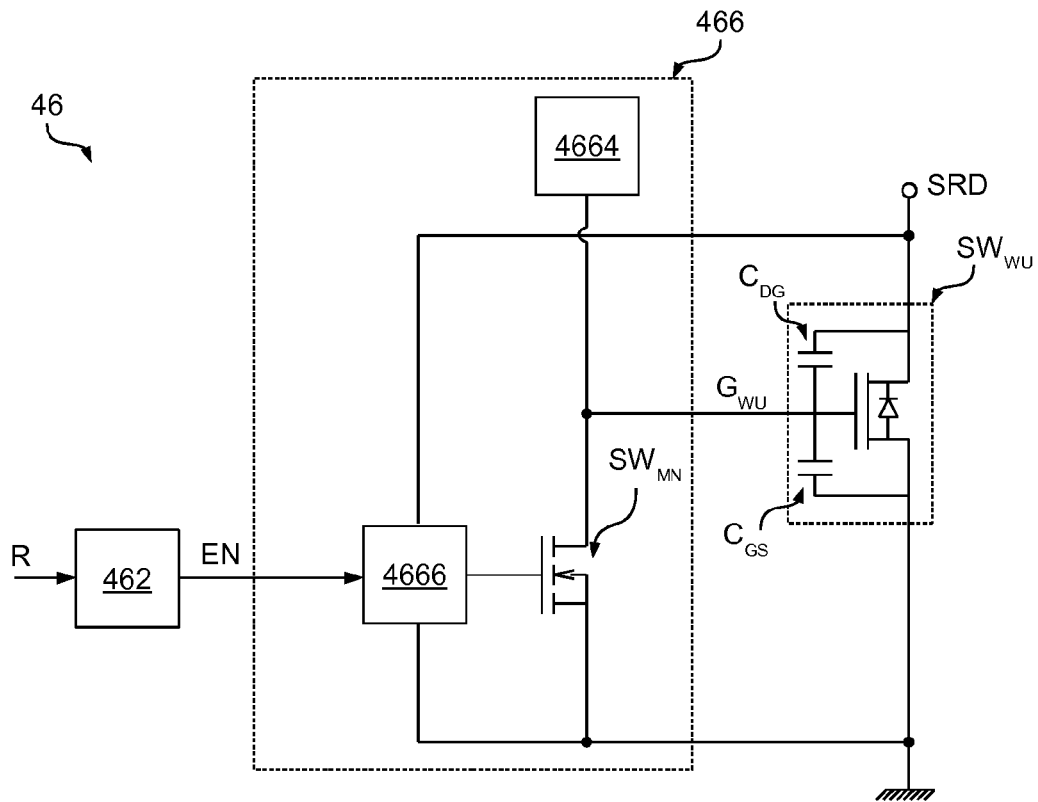

FIG. 12 shows the general architecture of this solution.

Also in this case, the circuit comprises a circuit 4664 that supplies a current for the gate $G_{WU}$ of the transistor $SW_{WU}$, such as for example a pull-up or a current generator connected to the voltage Vout.

In the embodiment considered, the transmission circuit 46 further comprises a driver circuit 4666 configured to draw energy from the node SRD and driving the gate of the transistor $SW_{MN}$ as a function of the signal EN. In particular, in some embodiments, the driver circuit 4666 is configured for generating a voltage at the gate of the transistor $SW_{MN}$ that is much higher than the threshold voltage $V_{TWU}$ of the transistor $SW_{WU}$.

In fact, in this way a considerable gain in terms of area occupied by the transistor $SW_{MN}$ is obtained as compared to the solution of FIG. 10.

Figure 13:
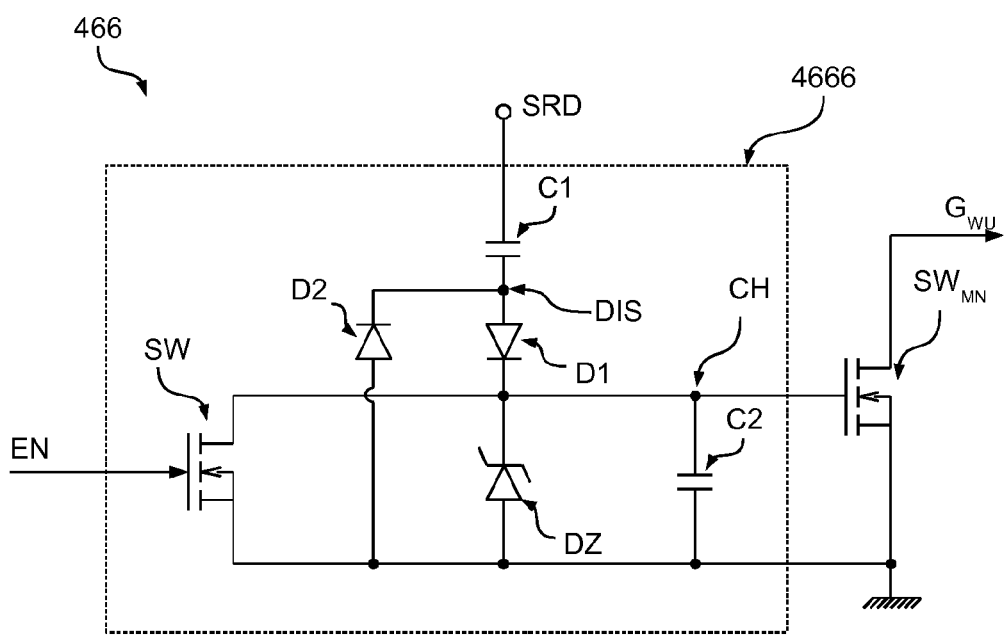

FIG. 13 shows a possible embodiment of the driver circuit 466, and in particular of the circuit 4666.

In particular, in the embodiment considered, the circuit 4666 uses a charge-pump technique for charging the gate of the transistor $SW_{MN}$, exploiting the transitions of the node SRD. For instance, in the embodiment considered, the rising transitions are exploited.

However, in general the circuit could also exploit the falling transitions or both of the transitions.

For example, in the embodiment considered, the circuit 4666 comprises a first capacitor C1 set between the node SRD and a node DIS. Basically, this capacitor decouples the DC offset of the node SRD; i.e., the capacitor C1 represents a decoupling capacitor.

The circuit 4666 further comprises a second capacitor C2 connected between the gate and the source of the transistor $SW_{MN}$. Basically, this capacitor C2 serves as accumulation capacitor for the charge pump.

In general, diodes are set between the node DIS and the capacitor C2 that transfer rising and/or falling transitions onto the capacitor C2.

For instance, in the embodiment illustrated in FIG. 12, i.e., in the case where the circuit exploits only the rising transitions, the circuit 466 may comprise:

a first diode D1 set between the node DIS and the gate of the transistor $SW_{MN}$ identified hereinafter also as node CH; i.e., the anode is connected to the node DIS, and the cathode is connected to the first terminal of the capacitor C2; and a second diode D2 connected between the source of the transistor $SW_{MN}$ and the node DIS; i.e., the anode is connected to the second terminal of the capacitor C2, and the cathode is connected to the node DIS.

In the embodiment considered, the circuit 4666 further comprises a switch SW configured for enabling the charge pump, i.e., inhibiting charging of the charge-accumulation capacitor C2 as a function of the feedback signal R, in particular the signal EN.

For instance, in the embodiment considered, the switch SW, such as for example an n-MOSFET, is configured for connecting the gate of the transistor $SW_{MN}$ to the ground $GND_2$, thus shortcircuiting the capacitor C2. Consequently, in the embodiment considered, the switch SW is connected between the gate and the source of the transistor $SW_{MN}$, and the driving signal EN is connected to the gate of the transistor SW.

In general, the circuit can also comprise other components, such as for example an optional Zener diode DZ connected between the gate and the source of the transistor $SW_{MN}$, in such a way as to limit the maximum voltage on the gate of the transistor $SW_{MN}$ and on the capacitor C2, i.e., on the node CH.

When the voltage $V_{SRD}$ $SW_{MN}$ the node SRD is high ($V_{SRD,high}$) the voltage $V_{C1}$ across $C_1$ is $$V_{C1} = V_{SRD,high} - (V_{CH} + V_{DON,D1}) \quad (3)$$

where $V_{CH}$ is the voltage on the node CH, i.e., on the gate of the transistor $SW_{MN}$, and $V_{DON,D1}$ is the voltage for switching on the diode D1.

Instead, during a falling transition, the voltage $V_{SRD}$ on the node SRD goes negative. For instance, in the case of a flyback converter (see, for example, FIG. 6) the voltage drops until the voltage for switching on the output diode Dout of the converter is reached. In this condition, the charge accumulated by the capacitor C1 is discharged through the diode D2. For instance, in the case of a flyback converter and assuming that the voltage for switching on the output diode Dout is equal to that of the diode D2, the capacitor C1 is discharged completely and the voltage $V_{C1}$ across it is 0 V.

This condition, i.e., the voltage across the capacitor C1, is maintained up to start of a new rising transition. Assuming for simplicity that the diodes D1 and D2 are ideal diodes (turn-on voltage equal to 0 V), at the end of a rising transition, the voltage $V_{C1}$ across the capacitor C1 may be simplified as:

$$V_{C1} = V_{SRD,high} - V_{CH}^{(2)} \quad (4)$$

where the voltage $V_{CH}^{(2)}$ indicates the voltage on the node CH at the end of the transition.

Instead, on the node CH there will be injected a charge equal to $$(V_{SRDH} - V_{CH}^{(2)}) \cdot C_1 \quad (5)$$

By imposing the charge balance on the node CH, we obtain $$V_{CH}^{(2)} = \frac{V_{SRD,high} \cdot C_1 + V_{CH}^{(1)} \cdot C_2}{C_1 + C_2} \quad (6)$$

where $V_{CH}^{(2)}$ is the voltage on the node CH at the end of the transition, while $V_{CH}^{(1)}$ is the voltage on the node CH before the transition.

In the case where the value of voltage on the node CH is considered negligible with respect the voltage $V_{SRD,high}$ reached by the node SRD, the variation of voltage of the node CH at each switching cycle of the stage 20 may be considered constant and equal to $$\Delta V_{CH} = \frac{V_{SRDH} \cdot C_1}{C_2} \quad (7)$$

Consequently, in order to prevent any damage to the transistor $SW_{MN}$, in various embodiments a Zener diode DZ is provided, configured for limiting the voltage across the capacitor C2 to a maximum voltage.

Consequently, in the solution described, the problem of turning on the transistor $SW_{WU}$ remains confined to the first switching strokes until the voltage $V_{GS}$ is reached on the node CH, which permits to have, on the transistor $SW_{MN}$, the minimum $R_{DSON}$ that guarantees maintenance of the off condition of the transistor $SW_{WU}$.

The number of "strokes", i.e., transfers of energy from the primary side to the secondary side, necessary for reaching the condition that guarantees that the transistor $SW_{WU}$ will not turn on may be determined even beforehand.

Consequently, in the embodiment considered, the possible loss of energy of the transformer T will be limited to the very first switching strokes and becomes negligible for the purposes of efficiency of the converter. In the same way, the risk of any malfunctioning will be prevented.

Like the solutions described previously, the transistor $SW_{MN}$ may be disabled through the signal EN, which is the same as the one that enables the driver of the wake-up MOSFET $SW_{MN}$ when the output of the converter reaches the turn-on threshold.

Consequently, the present description provides circuit solutions that enable use of the energy of the oscillations of the drain of the MOSFET $SW_{WU}$ due to the switching activity on the primary for charging a capacitor C2 and turning on a pull-down MOSFET $SW_{MN}$ that can keep the wake-up MOSFET $SW_{WU}$ off, thus preventing any dissipation of energy and any possible malfunctioning.

Of course, without prejudice to the principle of the invention, the details of construction and the embodiments may vary widely with respect to what has been described and illustrated herein purely by way of example, without thereby departing from the scope of the present invention, as defined by the ensuing claims.

The invention claimed is:
1. A power-supply circuit, comprising:
    a switching stage, comprising:
        a) a transformer having a primary winding and a secondary winding;
        b) at least one electronic switch set on a primary side of said transformer for selectively transferring energy through said primary winding to said secondary winding; and
        c) an energy accumulator set on a secondary side of said transformer, wherein said energy accumulator is charged by said energy transferred to said secondary winding;

a monitoring circuit configured for monitoring at least one signal on the secondary side of said transformer and generating a feedback signal as a function of said at least one signal; and a transmission circuit set on the secondary side of said transformer and configured for selectively transferring energy from said energy accumulator to said secondary winding in order to transmit said feedback signal, wherein said transmission circuit comprises:

a) a first electronic switch having a control terminal; and
b) a driver circuit for said first electronic switch, wherein said driver circuit comprises:
  a charge-accumulation capacitor configured to store a control voltage for application to said control terminal of said first electronic switch; and
  a charge circuit comprising a decoupling capacitor connected to a terminal of said secondary winding and configured for drawing energy from said secondary winding through the decoupling capacitor and charging said charge-accumulation capacitor by said drawn energy.

2. The power-supply circuit according to claim 1, wherein said energy accumulator comprises a capacitor configured for supplying a load.

3. The power-supply circuit according to claim 1, wherein said transmission circuit comprises a second electronic switch connected to the terminal of said secondary winding and controlled by said first electronic switch for selectively transferring energy from said energy accumulator to said secondary winding in order to transmit said feedback signal.

4. The power-supply circuit according to claim 3, wherein said first electronic switch and said second electronic switch are, respectively, a first MOSFET and a second MOSFET, wherein a drain of said first MOSFET is connected to a gate of said second MOSFET and a source of said first MOSFET is connected to a source of said second MOSFET.

5. The power-supply circuit according to claim 1, wherein said charge circuit comprises a plurality of diodes arranged between said decoupling capacitor and said charge-accumulation capacitor for transferring rising transitions of a voltage on said terminal of said secondary winding onto said charge-accumulation capacitor.

6. The power-supply circuit according to claim 1, wherein said driver circuit comprises a transistor switch for selectively activating and deactivating charging of said charge-accumulation capacitor as a function of said feedback signal.

7. The power-supply circuit according to claim 1, wherein said driver circuit comprises a clamp circuit for limiting a voltage across said charge-accumulation capacitor.

8. The power-supply circuit according to claim 1, wherein said switching stage is a flyback converter comprising an output diode set between said secondary winding and said energy accumulator for charging said energy accumulator by said energy transferred to said secondary winding.

9. The power-supply circuit according to claim 8, wherein an anode of said output diode is connected to a first terminal of said energy accumulator and a cathode of said output diode is connected to said terminal of said secondary winding, and wherein said charge circuit is configured for drawing energy from said terminal of said secondary winding.

10. The power-supply circuit according to claim 1, wherein said charge circuit comprises a plurality of diodes arranged between said decoupling capacitor and said charge-accumulation capacitor for transferring falling transitions of a voltage on said terminal of said secondary winding onto said charge-accumulation capacitor.

11. A transmission circuit designed to transmit a feedback signal in an electronic converter comprising a transformer with a primary winding and a secondary winding, the transmission circuit comprising:

a first n-MOSFET configured to selectively transfer energy to said secondary winding in order to transmit said feedback signal;

a second n-MOSFET having a drain connected to a gate of said first n-MOSFET and a source connected to a source of said first n-MOSFET; and a driver circuit configured to drive said second n-MOSFET, wherein said driver circuit comprises:
  a charge-accumulation capacitor connected to a gate of said second n-MOSFET; and
  a charge circuit configured to draw energy from a drain of said first n-MOSFET and charge said charge-accumulation capacitor with said drawn energy.

12. The transmission circuit according to claim 11 implemented as an integrated circuit.

13. The transmission circuit according to claim 11, wherein said driver circuit further comprises a decoupling capacitor having a first terminal coupled to a terminal of the secondary winding and a second terminal coupled to said charge-accumulation capacitor and the gate of said second n-MOSFET.

14. The transmission circuit according to claim 13, wherein said driver circuit further comprises a first diode connected between the second terminal of the decoupling capacitor an said charge-accumulation capacitor.

15. The transmission circuit according to claim 14, wherein said driver circuit further comprises a second diode connected between a reference voltage node and the second terminal of the decoupling capacitor.

16. The transmission circuit according to claim 11, wherein said driver circuit further comprises a clamp diode connected in parallel with the charge-accumulation capacitor.

17. The transmission circuit according to claim 11, wherein said driver circuit further comprises a transistor switch for selectively activating and deactivating charging of said charge-accumulation capacitor as a function of said feedback signal.

18. A power-supply circuit, comprising:

a switching stage, comprising:
  a) a transformer having a primary winding and a secondary winding;
  b) at least one electronic switch set on a primary side of said transformer for selectively transferring energy through said primary winding to said secondary winding; and
  c) an energy accumulator set on a secondary side of said transformer, wherein said energy accumulator is charged by said energy transferred to said at least one secondary winding;

a monitoring circuit configured for monitoring at least one signal on the secondary side of said transformer and generating a feedback signal as a function of said at least one signal; and a transmission circuit set on the secondary side of said transformer, wherein said transmission circuit comprises:
  a) a first MOSFET switch having drain connected to a terminal of the secondary winding and configured for selectively transferring energy from said energy accumulator to said secondary winding in order to transmit said feedback signal;

b) a second MOSFET switch having a drain connected to a gate of the first MOSFET switch, wherein a source of the first MOSFET switch is connected to a source of the second MOSFET switch; and c) a driver circuit for driving a gate of the second MOSFET switch, wherein said driver circuit comprises:
- a charge-accumulation capacitor configured to store a control voltage for application to said gate of said second MOSFET switch; and
- a charge circuit configured for drawing energy from said secondary winding and charging said charge-accumulation capacitor by said drawn energy.

19. The power-supply circuit according to claim 18, wherein said charge circuit comprises a decoupling capacitor connected to said terminal of said secondary winding.

20. The power-supply circuit according to claim 19, wherein said charge circuit comprises a plurality of diodes arranged between said decoupling capacitor and said charge-accumulation capacitor for transferring rising transitions of a voltage on said terminal of said secondary winding onto said charge-accumulation capacitor.

21. The power-supply circuit according to claim 19, wherein said charge circuit comprises a plurality of diodes arranged between said decoupling capacitor and said charge-accumulation capacitor for transferring falling transitions of a voltage on said terminal of said secondary winding onto said charge-accumulation capacitor.

22. The power-supply circuit according to claim 18, wherein said driver circuit comprises a transistor switch for selectively activating and deactivating charging of said charge-accumulation capacitor as a function of said feedback signal.

23. The power-supply circuit according to claim 18, wherein said driver circuit comprises a clamp circuit for limiting a voltage across said charge-accumulation capacitor.

24. The power-supply circuit according to claim 18, wherein said switching stage is a flyback converter comprising an output diode connected between said secondary winding and said energy accumulator for charging said energy accumulator by said energy transferred to said secondary winding.

25. The power-supply circuit according to claim 24, wherein an anode of said output diode is connected to a first terminal of said energy accumulator and a cathode of said output diode is connected to said terminal of said secondary winding, and wherein said charge circuit is configured for drawing energy from said terminal of the secondary winding.

26. The power-supply circuit according to claim 18, wherein said first and second MOSFET switches are n-type MOSFETs.

27. A transmission circuit for transmitting a feedback signal in an electronic converter comprising a transformer with a primary winding and a secondary winding, the transmission circuit comprising:
- a first MOSFET switch having a conduction terminal connected to a terminal of the secondary winding and configured control a selective transfer of energy to said secondary winding in order to transmit said feedback signal;
- a second MOSFET switch having a conduction terminal connected to a gate of said first MOSFET switch and configured for controlling actuation of said first MOSFET switch; and
- a driver circuit configured to drive a gate of said second MOSFET, wherein said driver circuit comprises:
  - a charge-accumulation capacitor connected to the gate of said second MOSFET switch; and
  - a charge circuit configured to draw energy from the terminal of secondary winding and charge said charge-accumulation capacitor with said drawn energy.

28. The transmission circuit of claim 27, wherein said driver circuit further comprises a decoupling capacitor having a first terminal coupled to said terminal of the secondary winding and a second terminal coupled to said charge-accumulation capacitor and the gate of said second MOSFET switch.

29. The transmission circuit of claim 28, wherein said driver circuit further comprises a first diode connected between the second terminal of the decoupling capacitor an said charge-accumulation capacitor.

30. The transmission circuit of claim 29, wherein said driver circuit further comprises a second diode connected between a reference voltage node and the second terminal of the decoupling capacitor.

31. The transmission circuit of claim 27, wherein said driver circuit further comprises a clamp diode connected in parallel with the charge-accumulation capacitor.

32. The transmission circuit of claim 27, wherein said driver circuit further comprises a transistor switch for selectively activating and deactivating charging of said charge-accumulation capacitor as a function of said feedback signal.

33. The transmission circuit of claim 27 implemented as an integrated circuit.

* * * * *